United States Patent
Ishikawa et al.

(10) Patent No.: US 6,741,623 B2
(45) Date of Patent: May 25, 2004

(54) SEMICONDUCTOR DEVICE, SEMICONDUCTOR LASER, THEIR MANUFACTURING METHODS AND ETCHING METHODS

(75) Inventors: Masayuki Ishikawa, Yokohama (JP); Shin-Ya Nunoue, Ichikawa (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 277 days.

(21) Appl. No.: 09/893,610

(22) Filed: Jun. 29, 2001

(65) Prior Publication Data
US 2002/0001864 A1 Jan. 3, 2002

(30) Foreign Application Priority Data
Jun. 30, 2000 (JP) .......................... 2000-199217

(51) Int. Cl.[7] .............................. H01L 33/00; H01S 5/00
(52) U.S. Cl. .............................. 372/45; 257/98; 257/52; 257/91; 257/103; 257/94; 257/79; 372/45; 372/46; 372/36; 372/48
(58) Field of Search .................. 438/791, 22, 47, 438/23, 27, 29, 42, 46, 31, 37, 39; 257/91, 52, 95, 98, 79, 15, 94, 96, 103; 372/46, 45, 36, 93, 44

(56) References Cited

U.S. PATENT DOCUMENTS 5,923,690 A * 7/1999 Kume et al. ............... 372/46
5,981,977 A   11/1999 Furukawa et al.

\* cited by examiner

*Primary Examiner*—Matthew Smith
*Assistant Examiner*—Igwe U. Anya
(74) *Attorney, Agent, or Firm*—Oblon, Spivak, McCelland, Maier & Neustadt, P.C.

(57) ABSTRACT

To provide a semiconductor device, such as semiconductor laser, having no need of complicated process, ensuring a high yield and mass-productivity necessary for cost reduction, and exhibiting excellent initial characteristics and reliability, nitride semiconductor layers containing a plurality of group III elements are formed on a base body surface having recess (opening) such that the nitride semiconductor layer varies in at least one of composition ratio of the group III elements, band gap energy, refractive index, electrical conductivity and specific resistance within the layer in response to the recess of the base body. In addition, by heating the structure in an atmosphere containing hydrogen and using a layer containing Al as an etching stop layer, controllability and production yield can be improved without influences from fluctuation in etching depth, or the like. Further, etching and re-growth can be conducted consecutively to provide an inexpensive process.

17 Claims, 9 Drawing Sheets

SEMICONDUCTOR DEVICE, SEMICONDUCTOR LASER, THEIR MANUFACTURING METHODS AND ETCHING METHODS

CROSS-REFERENCE TO RELATED APPLICATIONS

This application is based upon and claims the benefit of priority from the prior Japanese Patent Applications No. 2000-199217, filed on Jun. 30, 2000, the entire contents of which are incorporated herein by reference.

BACKGROUND OF THE INVENTION

1. Field of the Invention

This invention relates to a semiconductor device, semiconductor laser, their manufacturing methods and etching methods, and more particularly, to a semiconductor device using nitride semiconductors and requiring selective processing for a current confining structure, for example. The invention also relates to, in particular, a high-performance semiconductor laser controlled in current confinement and transverse mode, and a manufacturing method thereof.

2. Related Background Art

Group III nitride semiconductor materials, which enable realization of maximum band gap energies among III–V compound semiconductor materials and can make hetero junctions, are remarked as hopeful materials of semiconductor lasers and light emitting diodes for emission of short-wavelengths, or high-speed, high-output electronic devices. For typical devices using group III nitride semiconductor materials, thin-film forming techniques using metal-organic chemical vapor deposition (MOCVD) and epitaxial growth such as molecular beam epitaxy (MBE) are often used. In case of electronic devices having hetero junctions, such as semiconductor lasers, light emitting diodes, etc., those thin-film growth techniques are used to form a plurality of nitride mixed crystal thin film layers of group III elements different in composition ratio and use differences in band gap energy among these layers to confine light or electrons.

Such nitride mixed crystal thin film layers are typically formed on various base bodies. Upon their epitaxial growth, composition of a mixed crystal thin film layer grown under a fixed growth condition, i.e. composition of a mixed crystal thin film layer grown in a single process of crystal growth, was usually uniform over the entire surface. Usually, therefore, physical properties of the mixed crystal, such as band gap energy, refractive index, conductivity, specific resistance, and so on, were uniform over the entire surface of the thin film layer formed on the base body. Although there is a report about generation of non-uniformity, which reports fine deposition regions different in composition are formed in an InGaN thin film, from a macro-scale viewpoint, those physical properties are not but ones that should be regarded to be substantially uniform throughout the region having formed the thin film layer on the base body. Additionally, there is a report also regarding group III nitride semiconductors that a so-called "superlattice", made by periodically forming a plurality of very thin films of a thickness several to tens of times an atomic layer, has been made. Here again, those physical properties of the entirety of the superlattice layer are not but ones that should be regarded to be substantially uniform over the entire surface of the thin film layer on the base body.

Thus it has been considered that composition and physical properties of any nitride mixed crystal thin film layer made in a single process of crystal growth are inevitably uniform over the entire surface of the thin film layer. Therefore, in order to intentionally vary physical properties of the nitride mixed crystal thin film layer in the surface direction of the base body in a semiconductor laser, light emitting diode, electronic device, or the like, it has been necessary to carry out a plurality of epitaxial growth steps and etching steps, as well as additional complicated steps for positional alignment.

FIG. 12 is a cross-sectional view that shows configuration of a conventional semiconductor laser using nitride mixed crystal thin film layers. The laser of FIG. 12 includes an n-type GaN contact layer 912, n-type AlGaN cladding layer 914, InGaN quantum well active layer 916, p-type AlGaN cladding layer 918, and p-type GaN contact layer 920, which are thin film layers uniform in the surface direction, formed on a surface of a sapphire substrate 910 as a base body. The p-type cladding layer 918 is ridge-shaped to enhance the optical guide efficiency. For current confinement, the laser further includes an insulating film 930 having an opening above the ridge of the p-type cladding layer 918, and through this opening, a p-side electrode 950 is formed. Connected to the n-type contact layer 912 is an n-side electrode 940.

The semiconductor laser shown in FIG. 12 needs a complicated process including selective etching of the p-type cladding layer and others for making the waveguide, current confinement or electrode contact, formation of the insulating film 930, formation of the p-side electrode 950 and n-side electrode 940, and so on. It therefore involves the problems that the production yield is low and the productivity necessary for reducing the cost is low. Additionally, there is the problem that damage to crystals during etching and other process deteriorate the initial characteristics and reliability of the device.

As reviewed above, conventional techniques could only obtain uniform physical properties of any nitride mixed crystal thin film layer formed on a base body. So, for fabricating a semiconductor laser, light emitting diode, electronic device, or the like, the conventional techniques had to use processing techniques requiring a plurality of epitaxial growth and complicated positional alignment in order to vary physical properties such as band gap energy, refractive index, conductivity and specific resistance along the horizontal surface of the base body and for hereby eliciting functions. And this invited the problems that the production yield was low, productivity necessary for reducing the cost was low, or damage to crystals during the use of those processing techniques deteriorated the initial properties and reliability of the device.

On the other hand, apart from those problems, semiconductor lasers using nitride semiconductors had need of a technique that could reliably stop etching at a predetermined etching depth.

That is, blue semiconductor lasers using nitride semiconductors like InAlGaN, which have short wavelengths and can therefore make small beam diameters, are recently looked for as light sources for high-density information processing with optical disks, for example. For application to optical disc systems, for example, it is necessary to converge emanating beams of semiconductor lasers to minimum spots, and basic transverse mode oscillation is indispensable.

A number of devices with conventional ridge structures have been reported as nitride semiconductor lasers. Ridge structures, however, are characterized in that the difference in effective refractive index between the ridge portion important for transverse mode control and the exterior of the ridge largely depends on the etching depth. For years, dry etching represented by reactive ion etching (RIE) and reactive ion beam etching (RIBE) has been widely used in the etching process for making the ridge. However, regarding dry etching of nitride semiconductors, there is not yet established any technique, such as selective etching method, capable of stopping the etching at a target etching depth, and the etching depth is controlled by adjusting the etching time or by monitoring the progress of the etching through a laser interferometer, for example. With these control methods of the etching depth, however, it is difficult to stop the etching at the interface with the underlying layer or stop the etching so as to keep a desired thickness over the entire wafer surface, and sufficient control of the etching depth is impossible.

Thus, the conventional etching techniques cannot control the etching depth sufficiently. Additionally, since ridge structures are affected by the thickness profile of the film by crystal growth, etching depth profile, and so forth, it was difficult to fabricate devices controlled in basic transverse mode with a good yield. That is, in InAlGaN semiconductor lasers having conventional ridge structures, their structures themselves invite large influences to their characteristics from process accuracy and unevenness. Therefore, it was difficult to fabricate lasers for continuous oscillation in the basic transverse mode with a good yield.

SUMMARY OF THE INVENTION

The invention has been made under acknowledgement of the above-mentioned various problems.

It is therefore the first object of the invention to provide a semiconductor laser not requiring complicated processes, having a high yield and a productivity necessary for lowering the cost, and having excellent initial properties and reliability by varying the composition and physical properties of each nitride mixed crystal thin film layer formed in a single process of crystal growth within the film.

The second object of the invention is to provide a nitride semiconductor laser having a transverse mode control structure excellent in controllability of the etching depth, not affected by deterioration of the device properties due to etching damage, and excellent in productivity such as production yield.

The third object of the invention is to provide a semiconductor device not requiring complicated processes, having a high yield and a productivity necessary for lowering the cost, and having excellent initial properties and reliability by varying the composition and physical properties of each nitride mixed crystal thin film layer formed in a single process of crystal growth within the film.

The fourth object of the invention is to provide a manufacturing method of a laser device not requiring complicated processes, and having a high yield and a productivity necessary for lowering the cost by employing a technique that can made a nitride mixed crystal thin film layer different in composition and physical properties within the film in a single process of crystal growth.

The fifth object of the invention is to provide a selective etching technique of a nitride semiconductor, which can make an excellent transverse mode control structure.

With those problems taken into account, according to an aspect of the invention there is provided a semiconductor laser comprising:

a substrate;
a nitride semiconductor layer made of a nitride semiconductor on said substrate and having a stripe-shaped opening;
a buried layer burying said stripe-shaped opening and made of a nitride semiconductor containing at least two kinds of group III elements, said buried layer including a first portion lying in and above said opening and a second portion lying on said nitride semiconductor layer, said first portion of said buried layer being different from said second portion of said buried layer in composition ratio of said at least two kinds of group III elements; and
an active layer formed on said buried layer.

According to another aspect of the invention, there is provided a semiconductor laser comprising:

a substrate;
a first cladding layer of a first conduction type made of a nitride semiconductor of a first conduction type on said substrate;
a current blocking layer formed on said first cladding layer of the first conduction type and having a stripe-shaped opening which partly exposes said first cladding layer of the first conduction type, said current blocking layer having a first layer of a nitride semiconductor formed adjacent to said first cladding layer of the first conduction type and a second layer of a nitride semiconductor formed on said first layer, said first layer being made of a material more likely etched than said second layer and said first cladding layer of the first conduction type;
a second cladding layer of the first conduction type made of a nitride semiconductor of the first conduction type lying in and above said opening and on said current blocking layer so as to bury said stripe-shaped opening; and
an active layer formed on said second cladding layer of the first conduction type.

According to a further aspect of the invention, there is provided a semiconductor device comprising:

a base body having at least one recess; and
a buried layer made of a nitride semiconductor containing at least two kinds of group III elements lying on said base body to bury said recess with a part thereof, said buried layer including a first portion lying in and above said recess and a second portion lying outside of said recess wherein, said buried layer varying in composition ratio of said at least two kinds of group III elements between said first portion and said second portion.

According to a still further aspect of the invention, there is provided a semiconductor laser manufacturing method comprising:

forming a nitride semiconductor layer by a crystal growth for crystallographically growing a nitride semiconductor on a substrate;
selectively etching said nitride semiconductor to form a stripe-shaped opening;
forming a buried layer by crystallographically growing a nitride semiconductor containing at least two kinds of group III elements in and above said opening and on said nitride semiconductor layer; and
for forming an active layer of a nitride semiconductor on said buried layer.

According to a yet further aspect of the invention, there is provided a semiconductor laser manufacturing method comprising:

sequentially forming on a substrate an etching stop layer of a first conduction type nitride semiconductor, an etching layer of a nitride semiconductor and an etching mask layer of a second conduction type nitride semiconductor, said nitride semiconductor of said etching layer being more likely etched than those of said etching mask layer and said etching stop layer;

partly etching said etching mask layer to form a stripe-shaped first opening to expose a part of said etching layer in said first opening;

heating said etching layer in a mixed atmosphere containing hydrogen and at least one of nitrogen, ammonium, helium, argon, xenon and neon, or a mixed atmosphere of nitrogen and ammonium, or a hydrogen atmosphere to etch said etching layer exposed in said first opening and thereby form a stripe-shaped second opening to expose a part of said etching stop layer;

burying said first opening and said second opening with a buried layer of a first conduction type nitride semiconductor; and forming an active layer on said buried layer.

According to a yet further aspect of the invention, there is provided an etching method for selectively etching a first nitride semiconductor layer relative to a second nitride semiconductor layer comprising:

etching said first nitride semiconductor layer by heating it in a mixed atmosphere containing hydrogen and at least one of nitrogen, ammonium, helium, argon, xenon and neon; or a mixed atmosphere of nitrogen and ammonium; or and a hydrogen atmosphere.

As used in this specification, a "nitride semiconductor" pertains to any semiconductor having any composition in which composition ratios x, y and z vary within their respective ranges in the chemical formula $B_{1-x-y-z}In_xAl_yGa_zN$ ($x \leq 1$, $y \leq 1$, $z \leq 1$, $x+y+z \leq 1$). For example, InGaN ($x=0.4$, $y=0$, $z=0.6$) is also a kind of "nitride semiconductors" as used herein. Further, the "nitride semiconductors" should be construed to involve those in which part of the group V element, N (nitrogen), has been replaced by As (arsenic) or P (phosphorus). In this case, any such nitrogen semiconductor contain one of those three group III elements (In, Al, Ga) and at least N (nitrogen) as the group V element.

DESCRIPTION OF THE PREFERRED EMBODIMENTS

Embodiments of the invention will now be explained below with reference to the drawings.

First shown is the basic structure of semiconductor devices according to embodiments of the invention.

Figure 1:
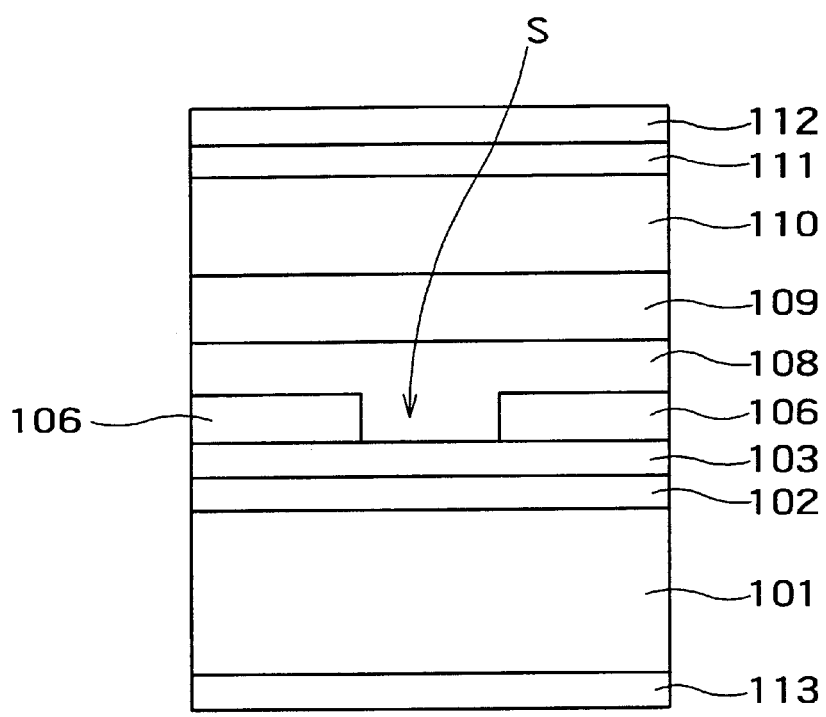
FIG. 1 is a schematic diagram illustrating a cross-sectional structure of a central part of any semiconductor laser according to an embodiment of the invention.

FIG. 1 is a schematic diagram that shows a cross-sectional structure of a central part of any semiconductor laser device according to embodiments of the invention. That is, FIG. 1 shows a cross-sectional structure of an edge-emitting semiconductor laser obtained by using the invention, which is viewed from its emanation edge, and shows an n-type buffer layer 102, first n-type cladding layer 103, current blocking layer 106, p-type contact layer 108, active layer 109, p-type cladding layer 110 and p-type contact layer 111 sequentially formed on an n-type substrate 101. The current blocking layer 106 has a stripe-shaped opening S extending substantially vertically to the drawing sheet, and this opening is buried with the second cladding layer 108. Formed on the p-type contact layer 111 is the p-side electrode 112 whereas the n-side electrode is formed on the bottom surface of the n-type substrate 101. Those layers from the buffer layer 102 to the p-type contact layer 111 may be made of nitride semiconductors.

Next explained are roles of the respective layers. The buffer layer 102 functions as a buffer for improving crystalline properties of the respective layer formed on the substrate 101. The cladding layers 103, 108, 110 each have a larger band gap than that of the active layer 109 and functions to confine carriers and light and thereby bring about laser oscillation. As explained later in greater detail, the active layer 109 also functions as an etching stopper layer during etching of the current blocking layer 106. The current blocking layer 106 serves as a block layer for confining a current injected from outside into the stripe-shaped core region. Additionally, as explained later in greater detail, the current blocking layer 106, having an stripe-shaped opening S, also functions to vary the second n-type cladding layer 108 grown thereon in composition in the surface direction. The active layer 109 functions to recombine injected carriers thereby to bring about emission of light corresponding to its band gap. The p-type contact layer 111 functions to reduce the contact resistance with the electrode formed thereon. The invention, however, is not restrictive to the illustrated conduction types, but the conduction types of respective layers may be inverted. Further, the current blocking layer may be positioned on the active layer.

With reference to the basic construction explained above, embodiments of the invention will be explained below.

(First Embodiment)

First referring to FIG. 1, the first embodiment of the invention will be explained. One of features of this embodiment is that the second n-type cladding layer 108 varies in composition between the portion in and above the stripe-shaped opening S and the portion on current blocking layer 106. That is, in this embodiment, the second n-type cladding layer 108 is made of a nitride semiconductor containing two or more kinds of group III elements. Moreover, composition ratios of these group III elements are different between the portion in and above the stripe-shaped opening S and the portion on current blocking layer 106.

For example, let the cladding layer 108 be made of AlGaN. Then, the Al composition of the cladding layer 108 is lower in and above the stripe-shaped opening S than on current blocking layer 106. Therefore, a profile of refractive indices corresponding to the waveguide stripe is produced within the cladding layer 108. That is, refractive index of the AlGaN cladding layer 108 formed inside and above the stripe-shaped opening S is higher than formed on current blocking layer 106. Therefore, the function of a waveguide for guiding light can be built in the cladding layer 108. As a result, lateral transverse mode of light propagating in the semiconductor laser can be efficiently confined, and the oscillation property can be improved significantly.

The in-plane distribution of composition of the cladding layer 108 can be produced in a single process of crystal growth by using the stripe-shaped opening S of current blocking layer 106 as explained below.

Figure 2:
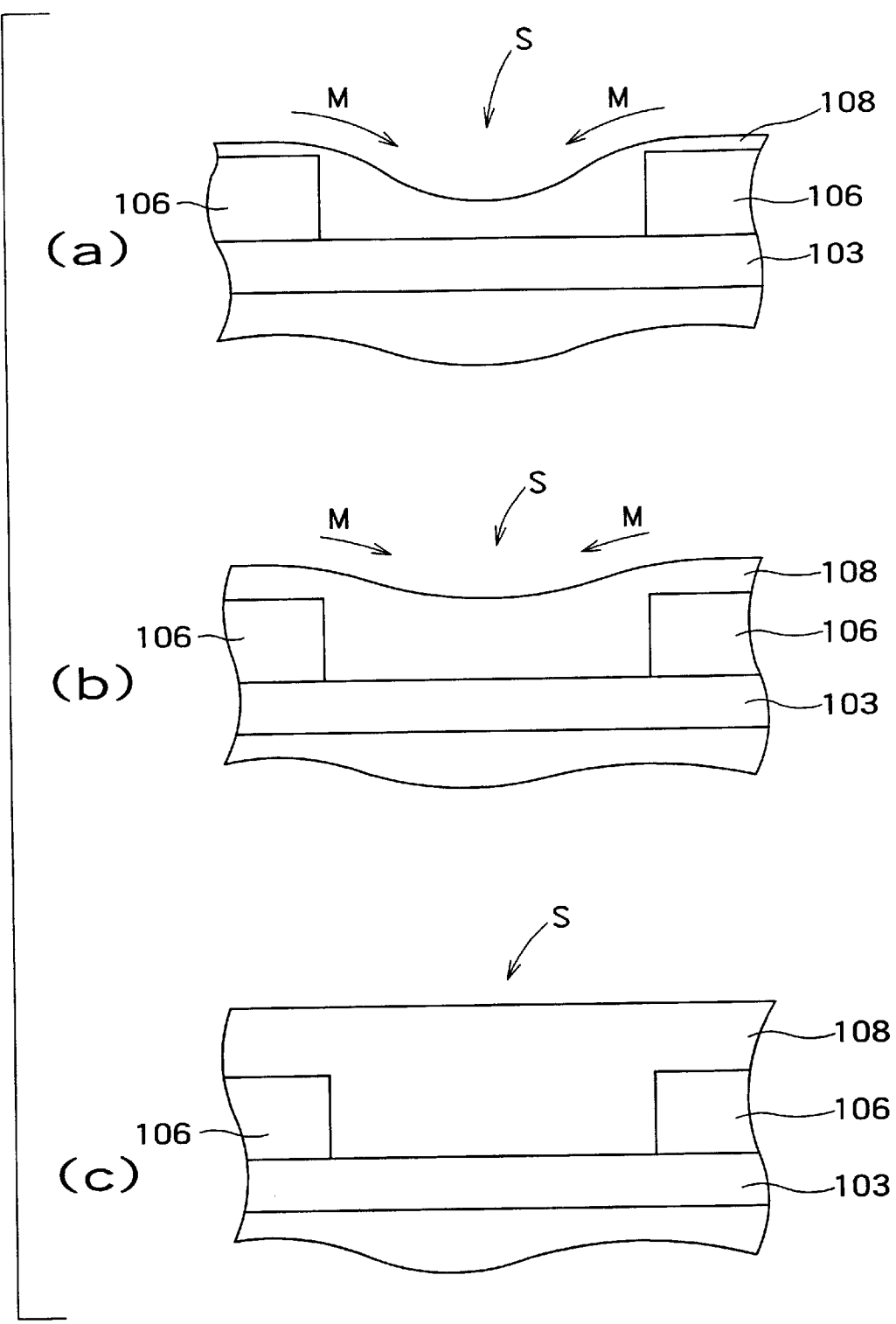
FIG. 2 presents cross-sectional views schematically showing a process for growing a cladding layer 108 on a current blocking layer 106.

FIG. 2 presents cross-sectional views schematically showing a process for growing the cladding layer 108 on the current blocking layer 106. Once the AlGaN cladding layer 108 is grown on the current blocking layer 106 having a stripe-shaped opening S by any of various deposition methods such as MOCVD or MBE, crystal growth initially starts while reflecting the shape of the opening S as shown in FIG. 2(a). However, as the crystal growth progresses, the opening S is gradually buried as shown in FIG. 2(b), and it is formed to a certain thickness, the opening S is fully buried, and the surface of the cladding layer 108 exhibits a substantially flat plane as shown in FIG. 2(c). Such flattening of the surface of the cladding layer 108 occurs because deposition particles flying onto the current blocking layer 106 migrate (move) into the opening S as shown by arrows M in FIG. 2. Its mechanism is presumed such that, in the group III source material or its decomposition product (including the group III element itself as well) supplied onto the base body by vapor phase deposition, for example, there is a difference in coupling force with the material covering the base body surface between Al (aluminum) and the other element (here is used Ga (gallium)), for example. That is, on the surface of the base body, Al or its decomposition product is unlikely to migrate as compared with Ga and its decomposition product. As a result, Ga migrates more than Al to opening S, and the Al composition decreases in and above the opening S.

Though, when the crystal growth progresses further after the opening S is fully buried, Ga does not migrate. Therefore, when AlGaN cladding layer 108 becomes thick, the Al composition of the surface side of the cladding layer 108 becomes uniform. As known from this specification, " AlGaN cladding layer 108 lying above the stripe-shape opening S " does not involve the portion of the above portion of the stripe-shape opening S where Ga does not migrate.

As explained above, according to the instant embodiment, nitride semiconductor layers each varying in composition and refractive index within the film can be made in a single process of crystal growth. That is, by making the stripe-shaped opening S in the current blocking layer 106 and making the cladding layer 108 to bury the opening recess, its possible to vary compositions of group III elements in the cladding layer to produce a profile of refractive indices, and thereby, the light confinement efficiency can be improved. In order to enhance this effect, it is desirable that group III elements forming the cladding layer 108 are largely different in migration rate, and hence likely to produce a difference in refractive index. When fabricating a nitride semiconductor laser, compositions can be varied easily by employing a material containing Al and another group III element as the nitride semiconductor forming the cladding layer 108.

In addition, according to the instant embodiment, since compositions of grown layers can be varied in accordance with recesss and projections along the base body surface, it is possible to not only produce a profile of refractive indices but also spatially change various physical properties including band gap energy, conductivity, specific resistance and so on. Therefore, not limited to semiconductor lasers, the invention is applicable to various kinds of optical devices and electronic devices.

(Second Embodiment)

Next explained is the second embodiment of the invention. This embodiment is directed to a structure based on the semiconductor laser shown in FIG. 1, for example, in which the stripe opening S of the current blocking layer 106 can be made reliably and easily, and an etching process thereof.

Figure 3:
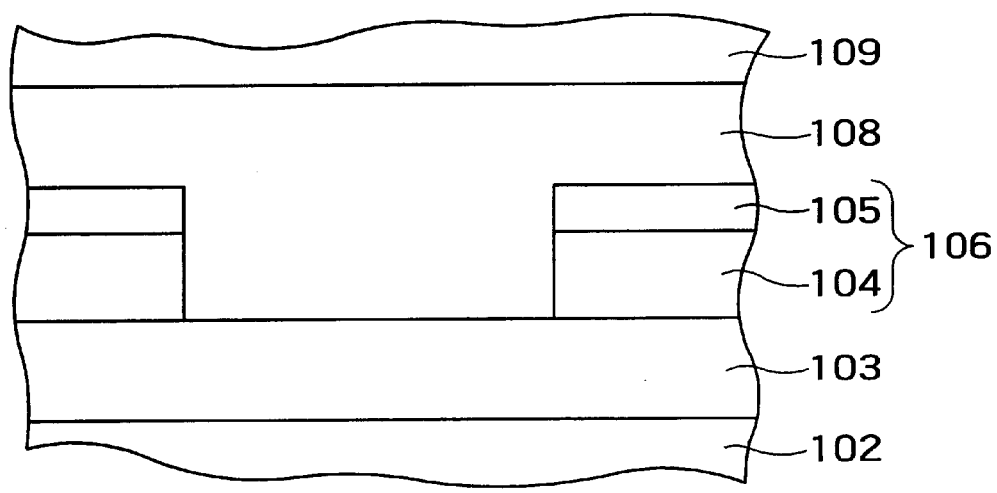
FIG. 3 is a cross-sectional view showing in an enlarged scale a central part including the current blocking layer 106 in the semiconductor laser of FIG. 1.

FIG. 3 is a cross-sectional view showing in an enlarged scale a central part including the current blocking layer 106 in the semiconductor laser of FIG. 1. That is, in the instant embodiment, the current blocking layer 108 is made by forming an etching layer 104 and an etching mask layer 105. The etching layer 104 is made of a material exhibiting a higher etching rate than the etching mask layer 105 under a predetermined etching condition.

For example, in case a nitride semiconductor is used, Al composition of the etching layer 104 is adjusted to be lower than the Al composition of the etching mask layer 105.

The first cladding layer 103 under the current blocking layer 106 functions as an etching stop layer. That is, a material is used for the first cladding layer 103, which exhibits a lower etching rate than the etching layer 104 under a predetermined etching condition. For example, if a nitride semiconductor is used, Al composition of the first cladding layer 103 should be higher than that of the etching layer 104.

As explained above, the instant embodiment uses the three-layered structure made up of the etching stop layer (first cladding layer) 103, etching layer 104 and etching mask layer 105.

Figure 4:
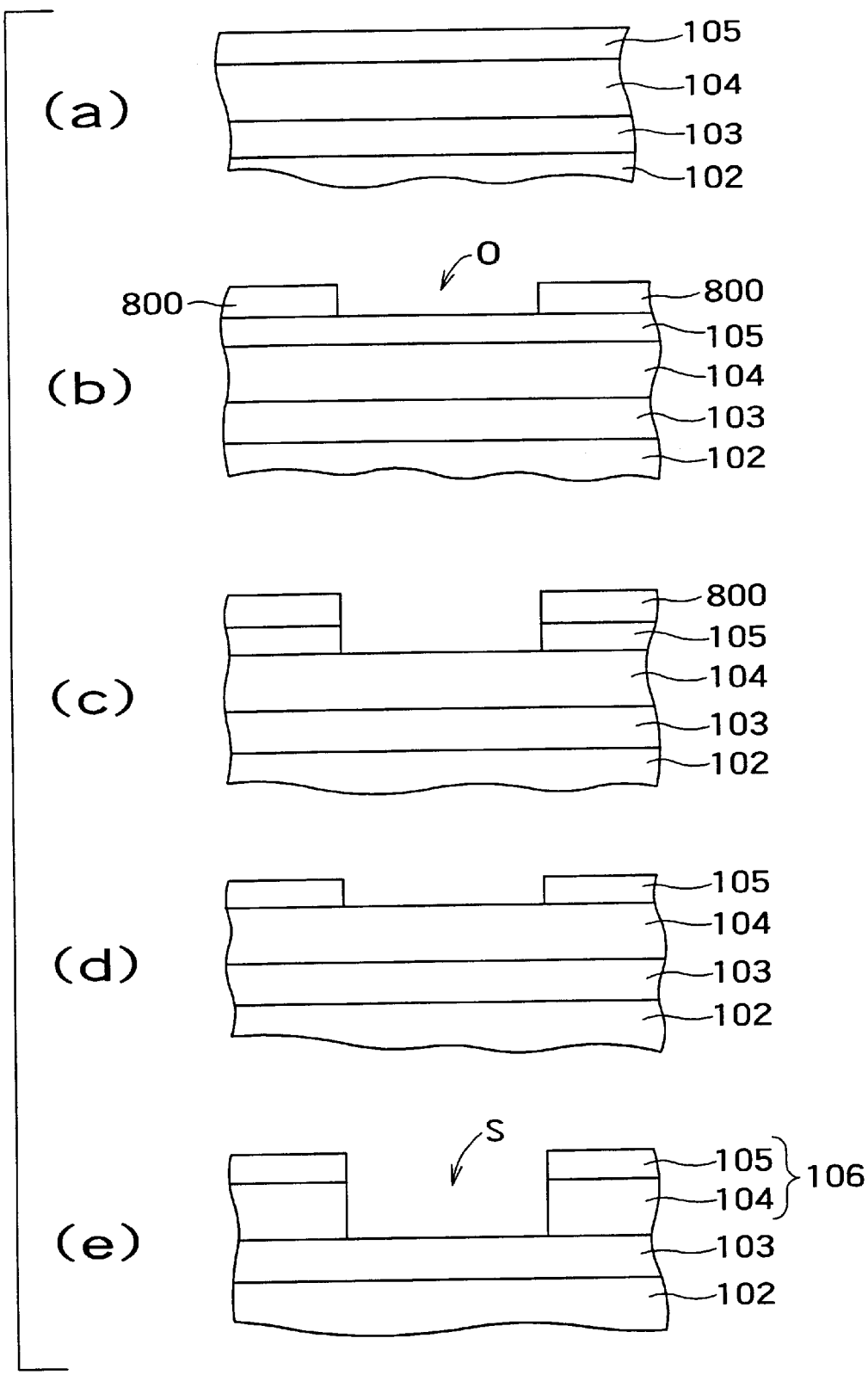
FIG. 4 presents schematic cross-sectional views showing an etching process according to the second embodiment of the invention.

FIG. 4 presents schematic cross-sectional views showing an etching process according to the second embodiment.

First as shown in FIG. 4(a), the etching stop layer 103, etching layer 104 and etching mask layer 105 are formed sequentially.

Next as shown in FIG. 4(b), a mask 800 having a predetermined opening O is formed on the etching mask layer 105. Material of the mask 800 may be adequately chosen from various materials including resist and silicon oxide, for example.

Next as shown in FIG. 4(c), the etching mask layer 105 is selectively etched by using a first etching method to make a first opening. The first etching method can be executed under a condition etching the etching mask 105 alone and not etching the etching layer 104.

Alternatively, the first etching method may be conducted under a condition etching the etching layer 104 as well. In this case, however, the etching has to be stopped before the etching layer 104 exposed in the opening O is fully removed by etching.

In case a nitride semiconductor is to be etched, usable as the first etching method is any of, for example, dry etching such as CDE (chemical dry etching), RIE (reactive ion etching) or ion milling, and wet etching using an etching liquid like KOH.

Next as shown in FIG. 4(d), the mask 800 is removed. This step, however, may be executed after the step shown in FIG. 4(e).

Next as shown in FIG. 4(e), using the etching mask layer 105 as a mask, the etching layer 104 is etched by a second etching method to form a second opening. The second opening and the above-mentioned first opening make up the opening S in FIG. 4(e). Hereinbelow, the first opening, second opening and opening S will be often called the opening collectively without distinguishing them from each other. The second etching method is conducted under a condition ensuring a high etching rate for the etching layer 104 and a low etching rate for the etching stop layer (first cladding layer) 103. Thus it is possible to reliably stop the etching to obtain the configuration with the etching layer 104 being removed and the etching stopper layer 103 being exposed.

More specifically, taking a nitride semiconductor as the object to be etched, a vapor phase etching method originally developed by the Inventor can be used as the second etching method. For example, let an example be taken, in which the etching stop layer 103 is made of AlGaN, the etching layer 104 of GaN (or AlGaN with a low Al composition) and the etching mask layer 105 of AlGaN. In this case, if the temperature is raised approximately to 1000° C. in an atmosphere containing hydrogen, the etching layer 104 is etched, but almost no etching occurs in the etching stop layer 103 and the etching mask layer 105. That is, it is possible to selectively etch the etching layer 104 alone and reliably stop the etching at he etching stop layer 103. This means that a predetermined configuration can be obtained by etching without inviting over-etching or under-etching. In addition, when using the vapor phase etching method, the crystal is not damaged by the etching gas or plasma.

Further, it became clear through researches by the Inventor that usable atmospheres ensuring the effect of vapor phase etching to nitride semiconductors include a mixed atmosphere combining one of nitrogen, ammonium, helium, argon and xenon with hydrogen, a mixed atmosphere combining two of those elements with hydrogen, a mixed atmosphere containing nitrogen and ammonium, and a hydrogen atmosphere.

One of features of these atmospheres is that they do not chemically react so hard with nitride semiconductors, unlike so-called etching gases heretofore used in conventional dry etching such as CDE and RIE. That is, the vapor phase etching method according to the invention has a unique feature in not using corrosive reactive gases having been used heretofore.

As explained above, according to the instant embodiment, by employing the three-layered structure of he etching stop layer 103, etching layer 104 and etching mask layer 105, and properly adjusting the etching method, the etching can be stooped reliably and easily at the etching stop layer 103, and a desired post-etching structure can be obtained. Therefore, various structures like current confinement structures or light confinement structures can be made precisely with a good reproducibility.

EXAMPLES

Regarding the first and second embodiments explained above, more detailed explanation will be made below by way of specific examples.

First Example

A specific example of the first embodiment explained above will be first explained below as the first example of the invention.

Figure 5A:
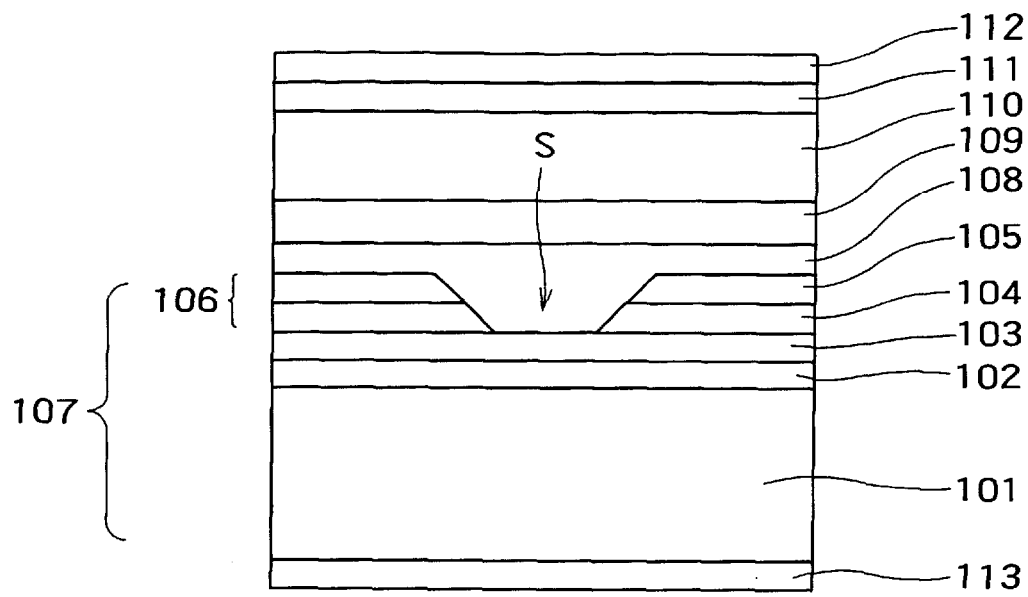
FIG. 5A is a schematic cross-sectional view that shows a central part of a semiconductor laser as the first example of the invention.

FIG. 5A is a schematic cross-sectional view that shows a central part of a semiconductor laser as the first example of the invention. In FIG. 5A, components identical or equivalent to those already explained with reference to FIG. 1 through FIG. 4 are labeled with common reference numerals. That is, the n-type GaN buffer layer 102 is formed on the n-type GaN substrate 101, and the first n-type AlGaN cladding layer 103 is formed on the n-type GaN buffer layer 102. Formed on the first n-type AlGaN cladding layer 103 is the current blocking layer 106 made up of the GaN layer 104 and the p-type AlGaN layer 105, and formed in the current blocking layer 106 is the stripe-shaped opening S that reaches the first n-type AlGaN cladding layer 103. These components heretofore mentioned form the base body 107. Aluminum composition of the first n-type AlGaN cladding layer 103 is preferably 0.30 or lower. If the aluminum composition exceeds 0.30, resistance of the layer substantially increases, and this is undesirable. In this example, aluminum composition of the first n-type AlGaN cladding layer 103 is 0.07. Aluminum composition of the p-type AlGaN layer 105 forming the current blocking layer 106 is preferably 0.05 or higher, and equal to or higher than the aluminum composition of the first n-type AlGaN cladding layer 103. Such composition ensures that the p-type AlGaN layer 105 effectively functions as a current blocking layer. In this example, aluminum composition of the p-type AlGaN layer 105 is 0.07, which is the same as that of the first n-type AlGaN cladding layer 103. The p-type AlGaN layer 105 may be a p-type AlN layer as well.

Formed on the base body 107 having the stripe-shaped opening S is the second n-type AlGaN cladding layer 108. Further, the active layer 109 having a quantum well structure containing InGaN is formed on the second n-type AlGaN cladding layer 108, and the p-type AlGaN cladding layer 110 and the p-type GaN contact layer 111 are formed on the active layer 109. The p-side electrode 112 is made of Pt (platinum)/Au (gold), for example, on the p-type GaN contact layer 111, and the n-side electrode 113 is made of Ti (titanium)/Al (aluminum) or Ti (titanium)/Au (gold) on the other surface of the n-type GaN substrate opposite from the active layer 109.

In the structure shown in FIG. 5A, the p-type AlGaN cladding layer 108 lies on the base body 107 having the stripe-shaped recess (opening) S, and Al composition of the p-type AlGaN layer 108 is lower in the and above the recess S than outside of the recess S. Therefore, horizontal transverse mode of light propagating in the semiconductor laser can be confined in the stripe channel portion.

Next explained is a manufacturing method of the semiconductor laser device of FIG. 5A.

First prepared is the Si-doped n-type (first conduction type) GaN substrate 101 having (0001) plane as its one surface, and grown thereon is the Si-doped n-type GaN buffer layer 102 by metal-organic chemical vapor deposition (MOCVD). Next grown is the Si-doped n-type $Al_{0.07}Ga_{0.93}N$ cladding layer 103 to the thickness of 0.6 $\mu$m. Next formed the current blocking layer 106 composed of the undoped GaN layer, 0.2 $\mu$m thick, and the Mg-doped p-type (second conduction type) $Al_{0.07}Ga_{0.93}N$, 0.2 $\mu$m thick.

After that, the wafer is removed from the growth apparatus and undergoes masking and selective etching by reactive ion etching (RIE) to make the stripe-shaped opening, 3 $\mu$m wide. In this etching process, a thickness, for example, 0.3 $\mu$m, is targeted, such that the channel penetrates at least the Mg-doped p-type AlGaN layer 105 and reaches the undoped GaN layer 104. Regarding the direction of the stripe, it should extend normally to the plane (1–100) of the GaN substrate 101.

After that, the wafer is returned into the growth apparatus and heated to a growth temperature in a mixed gas atmosphere containing hydrogen, nitrogen and ammonium. Then undoped GaN layer 104 exposed in the stripe-shaped opening is etched by etching progresses due to re-vaporization, and the n-type AlGaN cladding layer 103 is exposed. Through those steps, the base body 107 having recess on the surface is obtained.

Subsequently, the Si-doped n-type AlGaN cladding layer 108 is formed by MOCVD. In this step, by adjusting its Al composition to be $Al_{0.1}Ga_{0.9}N$ in the portion on the current blocking layer 106 and forming it to 0.2 $\mu$m. It resulted that Al composition in the portion of the opening S is $Al_{0.07}Ga_{0.93}N$. The thickness of AlGaN cladding layer 108 lying in and above the portion of opening S is 0.6 um, while rendering the surface of AlGaN cladding layer substantially flat.

Next formed on the n-type AlGaN second cladding layer 108 is the active layer 109 having: 0.1 $\mu$m thick undoped GaN layer, 10 nm thick Si-doped $In_{0.02}Ga_{0.98}N$ barrier layer, the quantum well structure region made by repeating two cycles of 4 nm thick undoped $In_{0.08}Ga_{0.92}N$ and 10 nm thick Si-doped $In_{0.02}Ga_{0.98}N$ barrier layers, cap layer made up of 20 nm thick undoped $In_{0.02}Ga_{0.98}N$ and 20 nm thick Mg-doped $Al_{0.2}Ga_{0.8}N$, 0.1 $\mu$m thick Mg-doped GaN layer. Further formed on the active layer 109 are the 0.6 $\mu$m thick Mg-doped p-type $Al_{0.07}Ga_{0.93}N$ cladding layer 110 and the 0.2 $\mu$m thick Mg-doped p-type GaN contact layer 111.

After that, the wafer with grown crystals on one surface of n-type GaN substrate is removed from the growth apparatus, and the p-side electrode 112 made of Pt/Au is formed on the p-type GaN contact layer 111. Further, the other surface of n-type GaN substrate 101 is polished until obtaining a thickness around 80 $\mu$m, and the n-side electrode 113 made of Ti/Au is formed on the other surface of the n-type GaN substrate 101.

After that, the wafer having the structure is cleaved into bars such that a plane normal to the stripe direction of the laser, i.e. the (1–100) plane of the GaN substrate 101, comprises each edge of each bar. Edges of each cleaved bar undergoes adequate edge coating, and thereafter dicing and braking, thereby to separate them in form of discrete chips. Each chipped laser device will be attached on a heat sink, with its p-side electrode 112 adjacent to the heat sink, by welding using an AuSn (gold-tin) solder, for example.

The semiconductor laser obtained through those steps not only exhibited a good current confinement performance, but also exhibited good properties including: maintaining basic modes in both vertical and horizontal transverse modes even under high optical outputs beyond 50 mW used for writing onto optical disks, permitting only a sufficiently low optical output by spontaneous radiation near the oscillation threshold current, and decreasing noise even during low-power reading.

That is, by having nitride mixed crystal thin film layers formed on a base body to locally vary in physical properties, which was difficult with conventional techniques, the method could actually manufacture a semiconductor laser device, which has a lower Al composition in and above the recess S than outside of the recess S, productivity necessary for reducing the cost, and excellent initial characteristics.

The essence of the mechanism enabling fabrication of such a high-performance device lies in that the AlGaN layer 108 could be made on the base body 107 having the stripe-shaped recess S to have a higher Al composition in and above the recess S than outside of the recess S and that the AlGaN layer 108 could be formed thick to represent a substantially flat surface. As a result, refractive index was higher in and above the recess S portion than that outside of the recess S portion, and the function of a waveguide for guiding light could be built in.

The reason why this structure can be made is presumably that, among group III source materials and their decomposition products (including group III elements themselves) supplied onto the base body by vapor phase deposition, there is a difference in coupling force with a material covering the base body between those containing Al and those containing any other (Ga, in this example).

That is, it is considered that, at the temperature from about 1000° C. to about 1100° C. where AlGaN layer 108 is formed, comparing with Ga source materials and their decomposition products, Al source materials or their decomposition products have larger coupling forces to base body surface, and smaller liability to migration along the base body surface. Therefore, materials with a lower Al composition is formed in and above the recess S. It is also assumed that the assumed mechanism also contributes to acceleration of growth rate in and above the recess S. These effects are weakened as the surface becomes more flatter together with the progress of the crystal growth on the base body surface, and this is considered to result in flattening the surface of the AlGaN layer 108.

In the example shown above, the n-type AlGaN cladding layer contains Al and Ga mixed in bulk; however, it may be a superlattice AlGaN layer made by repeating some cycles of GaN layers and AlGaN layers.

Figure 5B:
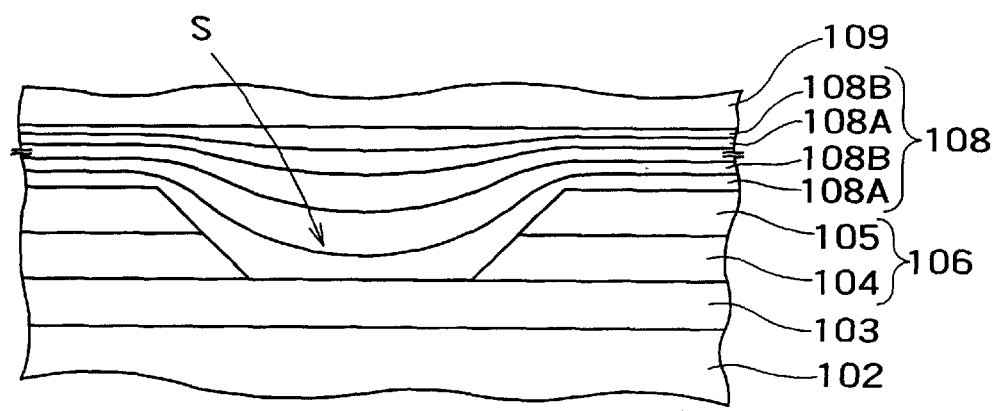
FIG. 5B is a schematic, enlarged, cross-sectional view of a central part of a semiconductor laser as the first example of the invention.

FIG. 5B is a schematic, enlarged, cross-sectional view of a central part of a semiconductor laser having such a superlattice AlGaN layer. That is, the cladding layer 108 has a structure alternately forming AlGaN barrier layers 108A and GaN well layers 108B. Even when the opening S is buried with the superlattice structure, composition of group III elements can be varied similarly. That is, by changing composition and thickness of each thin-film layer forming the superlattice between portion in and above the recess S and portion outside of the recess S, a waveguide structure equivalent to that of the bulk layer can be made. More specifically, Al composition of the AlGaN barrier layer 108A is lower in and above the recess S than outside of recess S. As a result, mean refractive index of the superlattice cladding layer 108 is higher in and above the recess S than outside of the recess S, and light confinement efficiency can be raised there.

FIG. 5B shows the superlattice structure in an abridged form for simplicity. Actually, however, barrier layers 108A and well layers 108B are thinner than illustrated, and the number of layers may be more than illustrated, respectively.

In the example shown above, the current blocking layer 106 is made up of the undoped high-resistance first layer 104 and the Mg-doped p-type second layer 105. However, only if the current blocking layer 106 has the function of blocking part of the current injected into the active layer 109, the first layer 104 and the second layer 105 may be changed in conduction type. For example, while maintaining the first layer 104 as it is, the second layer 105 may be changed to a high-resistance layer, or the first layer 104 may be changed to a p-type layer while maintaining the second layer 105 as it is. Alternatively, the first layer 104 may be changed to a p-type layer, and the second layer 105 to a high-resistance layer.

Furthermore, the above example has been explained as using conductive GaN as the substrate. However, insulating substrate such as sapphire can be used, then p-side and n-side electrodes is formed on same said of the insulating substrate. And having nitride mixed crystal thin film layers on the base body varied in physical properties within the horizontal plane of the base body, which was difficult conventionally, it is possible to provide a semiconductor laser device having a high yield, productivity necessary for cost reduction, excellent initial characteristics and reliability without using complicated processes.

The above example has been explained, taking a semiconductor laser which includes a stripe-shaped recess as its base body and nitride semiconductor layers that are formed on the base body and contain a plurality of group III elements including at least Al. However, the recess need not be stripe-shaped, and a similar confining structure made by a circular or rectangular opening is applicable to a surface emitting laser. Here again, by having nitride mixed crystal thin film layers on the base body varied in physical properties within the horizontal plane of the base body, which was difficult conventionally, it is possible to provide a semiconductor laser device having a high yield, productivity necessary for cost reduction, excellent initial characteristics and reliability without using complicated processes.

Moreover, although the above example has been explained as applying it to a semiconductor laser, it can be applied to light emitting diodes, optical waveguides, optical switches, and so on, in which at least one of composition ratios of group III elements, band gap energy, refractive index, conductivity and specific resistance of nitride semiconductor layers, which are formed on a base body having recess and contain a plurality of group III elements, varies within each layer in accordance with recesses and projections of the base body to have one or both of the current confinement function and the optical waveguide function. And here again, by having nitride mixed crystal thin film layers on the base body varied in physical properties within the horizontal plane of the base body, which was difficult conventionally, it is possible to provide a semiconductor device having a high yield, productivity necessary for cost reduction, excellent initial characteristics and reliability without using complicated processes.

Second Example

A specific example of the second embodiment explained above will be next explained below as the second example of the invention.

Figure 6:
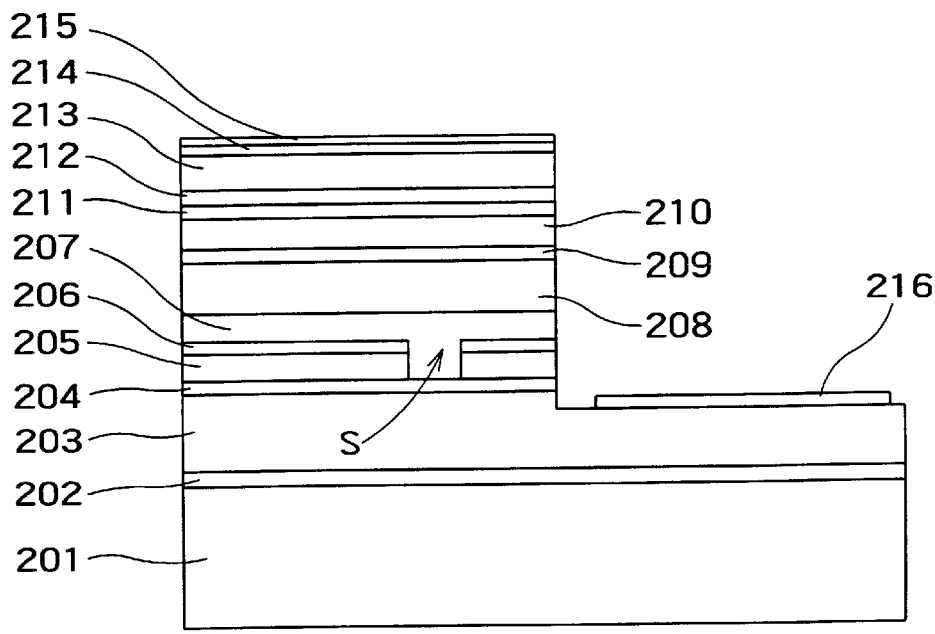
FIG. 6 is a diagram that shows a cross-sectional structure of a nitride semiconductor laser according to the second example of the invention.

FIG. 6 is a diagram that shows a cross-sectional structure of a nitride semiconductor laser according to the second example of the invention. That is, in the laser shown here, sequentially formed on a sapphire substrate 201 are a GaN buffer layer 202, Si-doped GaN n-type contact layer 203, Si-doped AlGaN n-type etching stop layer 204, non-doped GaN etching layer 205, and Mg-doped AlGaN p-type etching mask layer 206. A stripe-shaped opening S is formed in the etching mask layer 206 and the etching layer 205, and a Si-doped GaN buried layer 207 is buried and formed flatly. The Mg-doped AlGaN etching mask layer 206 functions as the current blocking layer.

Further formed on the Si-doped GaN buried layer 207 are a Si-doped AlGaN n-type cladding layer 208, Si-doped GaN n-type optical guide layer 209, InGaN multiquantum well (MQW) active layer 210, Mg-doped AlGaN p-type block layer 211, Mg-doped GaN a p-type optical guide layer 212, Mg-doped AlGaN p-type cladding layer 213, and Mg-doped GaN p-type contact layer 214.

Then, those layers are selectively removed by etching from the p-type contact layer 214 to a half depth of the n-type contact layer 203, an n-side electrode 216 is formed on the surface of the exposed n-type contact layer 203, and a p-side electrode 215 is formed on the surface of the p-type contact layer 214.

Conventional ridge-structured lasers need a process of forming the p-side electrode 215 on the top surface of a ridge approximately 2 $\mu$m wide. This was a difficulty about reproducibility because of the process, and led to a decrease of the yield. In contrast, in the instant example, since the etching mask layer 206 serving as the current blocking layer is formed between the active layer 210 and the substrate 201 and the surface is buried and flattened later, the p-side electrode 215 can be made on the flat and wide surface.

Additionally, as already explained, ridge structures also involved the problem that the difference in effective refractive index between the ridge portion and the exterior of the ridge portion, important for transverse mode control, largely depends on the etching depth. Therefore, ridge structures are seriously affected by controllability of the etching process and the film thickness profile, and this also decreases the yield. In contrast, the instant example is characterized in being free from the etching depth control accuracy, having a high yield and ensuring stable device characteristics.

Figure 7:
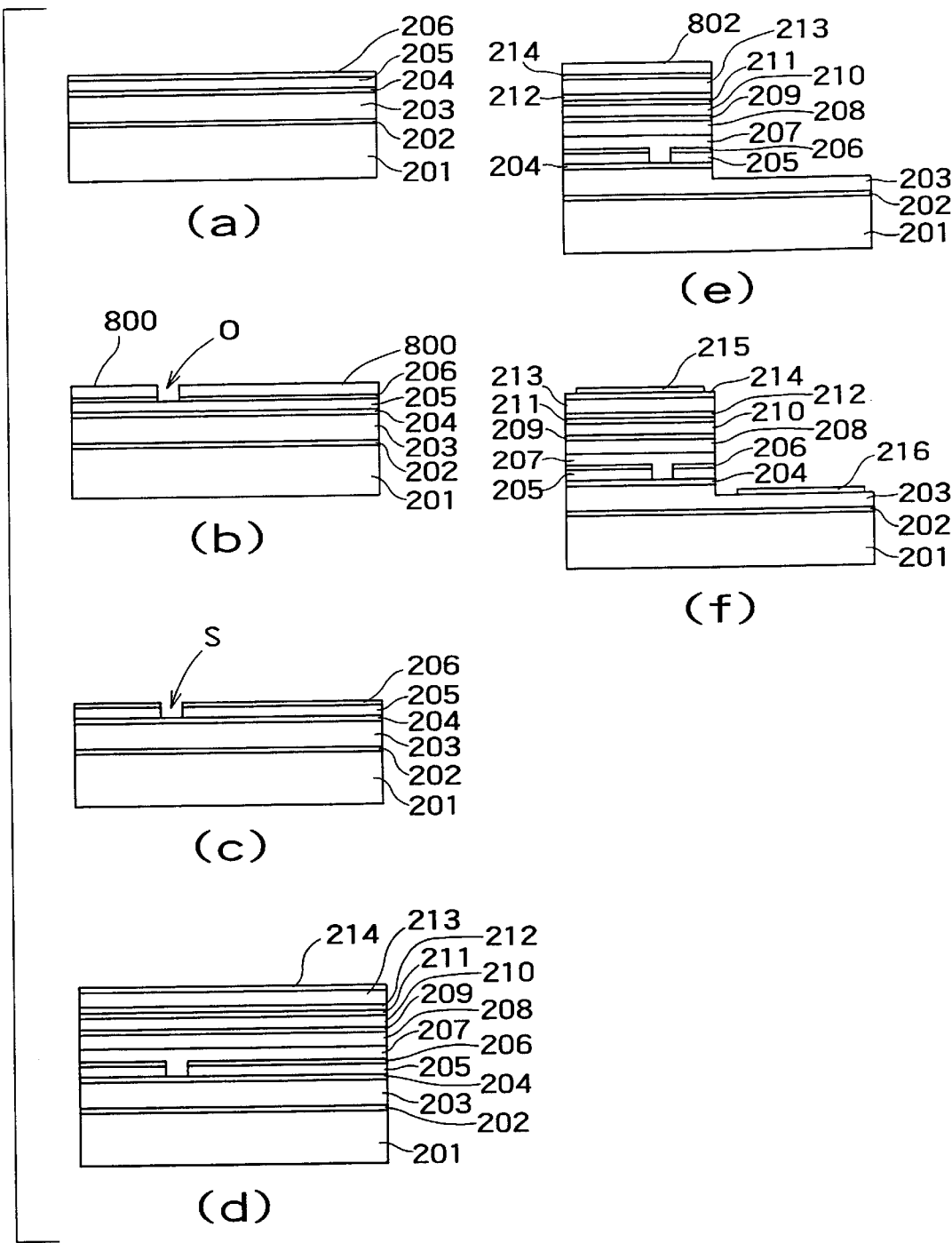
FIG. 7 presents cross-sectional views showing a manufacturing process in a manufacturing method of a semiconductor laser taken as the third example of the invention.

Next referring to FIG. 7, which shows steps of a process in cross-sectional views, a manufacturing method of the nitride semiconductor laser shown in FIG. 6 will explained below. One of features of the semiconductor laser manufacturing method of FIG. 7 lies in employing the aforementioned vapor phase etching to etch the etching layer 205 in the step of FIG. 7(c).

First with reference to FIG. 7(a), the buffer layer 202 composed of GaN, AlN or AlGaN is grown to a thickness around the range of 10 to 200 nm on the sapphire substrate 201 by metal-organic chemical vapor deposition (MOCVD), and thereon, the Si-doped GaN n-type contact layer 203 is grown to the thickness of 3 $\mu$m. Subsequently, the Si-doped $Al_{0.07}Ga_{0.93}N$ n-type etching stop layer 204, 0.1 $\mu$m thick, non-doped GaN etching layer 205, 0.2 $\mu$m thick, and Mg-doped $Al_{0.2}Ga_{0.8}N$ p-type etching mask layer 206, 0.1 $\mu$m thick, are formed.

After that, the substrate is removed from the MOCVD apparatus, then as shown in FIG. 7(b), a resist or $SiO_2$ mask 800 is formed on the etching mask layer 206, and a stripe-shaped opening O is formed in the mask 800 by an exposure process, for example. Thereafter, using the opening O of the mask 800, the etching mask layer 206 is selectively removed by etching to obtain the stripe-shaped opening in the etching mask layer 206 as shown in FIG. 7(b). In this etching process, dry etching or wet etching using KOH or other etching liquid may be employed. Thereafter, the mask 800 is removed, the substrate is again set in the MOCVD apparatus, 20 SLM of nitrogen gas is supplied, and the substrate temperature is raised to 1000° C. In this heating process, moisture and impurity gas having adhered on the substrate are removed. In the nitrogen atmosphere, GaN and AlGaN are not etched substantially.

After that, introduction of hydrogen gas is started, and as shown in FIG. 7(c), the etching layer 205 exposed in the opening is etched by the aforementioned vapor phase etching. More specifically, when the substrate temperature reaches 1000° C. in the preceding heating process, introduction of hydrogen gas is started to flow a mixed gas of 20 SLM of nitrogen gas and 10 SLM of hydrogen gas. Then the substrate is held in the atmosphere at 1000° C. for two minutes. In this step, although the etching mask layer 206 and the etching stop layer 203 both made of AlGaN are not etched, the etching layer 205 made of GaN is etched. That is, in this process, selective etching of GaN relative to GaN is attained. Therefore, as shown in FIG. 7(c), the GaN etching layer 205 is etched in the depth direction, and the etching no more progresses in the depth direction when it reaches the AlGaN etching stop layer 204.

Here is considered that the reason why GaN is etched lies in that it decomposes and sublimates by reaction with hydrogen. For example, in case of GaN, by reacting with hydrogen, it presumably decomposes to Ga (vapor phase) and $NH_3$ (vapor phase), and results in being etched. On the other hand, it is considered that the reason why AlGaN is not etched lies in that containment of Al enhances coupling force with group V elements and makes it difficult to decompose.

Experiments by the Inventor clarified that the etching temperature is preferably maintained at an adequate value in order to selectively etch GaN relative to AlGaN. If the etching temperature is too high, AlGaN is also etched in addition to GaN, and the etching rate increases too high to readily control the degree of side etching. In contrast, if the etching temperature is too low, the etching rate decreases to an impracticably low level. Through experiments by the Inventor, the temperature range higher than 800° C. and not exceeding 1150° C., more preferably, the temperature range from 1000° C. to below 1150° C., is considered appropriate. The instant example is an example in which this temperature is set at 1000° C.

Furthermore, according to experiments by the Inventor, the mixture ratio of the hydrogen gas flow amount relative to the total gas flow amount is preferably maintained in an appropriate value in order to selectively etch GaN relative to that AlGaN. If the mixture ratio of hydrogen is excessively large, the etching rate becomes to high to readily control the side etching. In contrast, if the mixture ratio of hydrogen is excessively small, the etching rate will become impracticably low. According to experiments by the Inventor, mixture ratio of the hydrogen gas flow amount relative to the entire gas flow rate is preferably in the range from 0.1 to 0.5. The instant example is an example in which total gas flow amount is 30 SLM, hydrogen gas flow amount is 10 SLM, and the mixture ratio is 0.33.

Additionally, according to experiments by the Inventor, aluminum compositions of the etching stop layer 204 and the etching mask layer 206 of FIG. 7(c) are desired to be 0.05 or higher. If the aluminum composition is below 0.05, the etching stop layer 204 and the etching mask layer 206 are also etched, and the selectivity lowers. Although the instant example uses GaN as the etching layer 205, subject to an appropriate selectivity being obtained, the etching layer 205 may be made of AlGaN having a smaller aluminum composition than those of the etching stop layer 204 and the etching mask layer 206.

Next as shown in FIG. 7(d), layers are grown by crystal growth. First of all, the supply of hydrogen gas is stopped, the supply of ammonium gas is started, and a mixed gas of 20 SLM of nitrogen gas and 10 SLM of ammonium gas is flown. Simultaneously, the substrate temperature is raised to 1080° C. In this process, the temperature can be raised in the mixed gas atmosphere containing nitrogen gas and ammonium gas while preventing the GaN etching layer 205 from being etched in the transverse direction. When the substrate temperature reaches 1080° C., the supply of trimethyl gallium (TMG), silane gas and hydrogen gas is simultaneously started to grow the Si-doped GaN buried layer 207. During growth of this layer, the 0.3 $\mu$m deep opening S made in the foregoing etching process was buried flat by growing 0.2 $\mu$m thick Si-doped GaN. Further formed sequentially are the Si-doped AlGaN n-type cladding layer 208, Si-doped GaN n-type optical guide layer 209, active layer of the InGaN multi quantum well (MQW) structure 210, Mg-doped AlGaN p-type block layer 211, Mg-doped GaN p-type optical guide layer 212, Mg-doped AlGaN p-type cladding layer 213, and Mg-doped GaN p-type contact layer 214.

Next as shown in FIG. 7(e), the multi-layered structure is etched to expose the n-type contact layer 203. That is, the substrate is removed from the MOCVD apparatus, the mask 802 is formed on the p-type contact layer 214 by an exposure process, and the layers are selectively etched to a halt depth of the n-type contact layer 203 by dry etching.

Next as shown in FIG. 7(f), the n-side electrode 216 is formed on the exposed surface of the n-type contact layer 203, and the p-side electrode 215 is formed on the surface of the p-type contact layer 214. Thereafter, the sapphire substrate is polished from its bottom surface until the thickness becomes 80 $\mu$m or less, and the structure is cleaved into chips having laser edges. One-side laser edges undergo high-reflectance coating of $SiO_2$ and $TiO_2$. Each chipped substrate is mounted on a heat sink and its n-side electrode and p-side electrode under wire bonding to complete a laser device.

As explained above, the instant example uses a series of selective etching process by vapor phase etching and re-growth as the method of making the current confinement structure. As already explained, selective etching by vapor phase etching can stop the etching at the interface between the GaN etching layer 205 and the AlGaN etching stop layer 206. That is, even with a thickness profile along the surface of the grown etching layer 205, the GaN etching layer 205 is removed by etching to make out the current confinement structure.

In contrast, if the conventional dry etching is used for making the current confinement structure, not yet having a sufficient selective etching condition, it is not possible to stop the etching at the interface throughout the entire surface when a profile exists in film thickness within the wafer surface, and it result in an unacceptable yield because the etching stop layer locally remain, or over-etched. There is also the problem that damage by dry etching is retained.

According to this example, the current confinement structure could be made easily while ensuring an excellent reproducibility over a wide range of the substrate.

Third Example

Next explained is a modification of the foregoing second example, taken as the third example of the invention.

Figure 8:
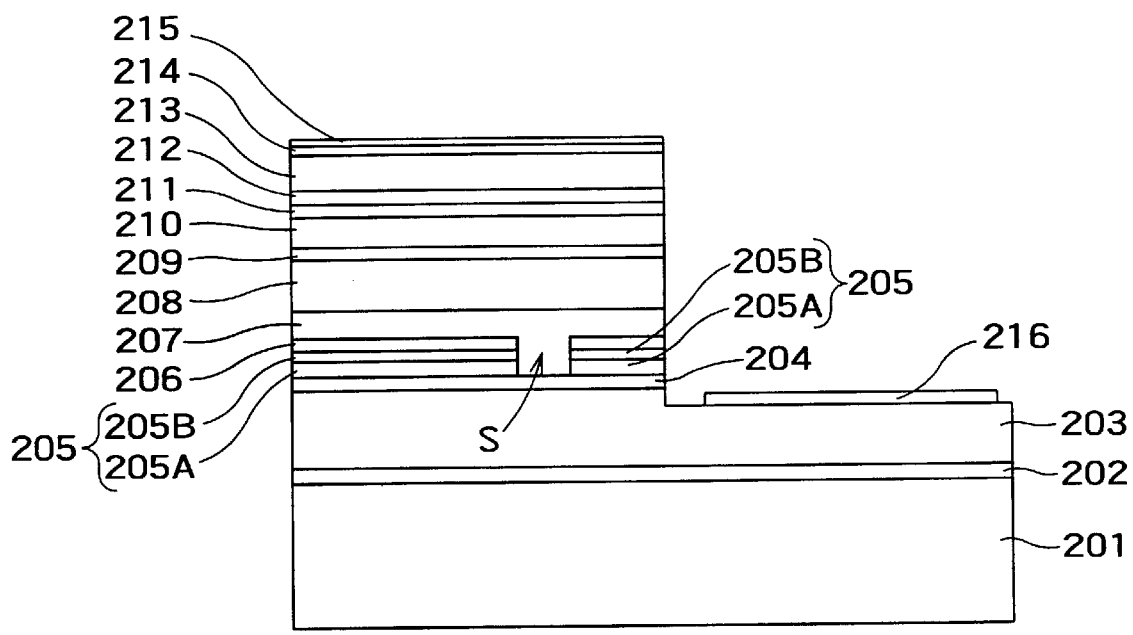
FIG. 8 is a schematic diagram that shows a cross-sectional structure of the semiconductor laser taken as the third example of the invention.

FIG. 8 is a schematic diagram that shows a cross-sectional structure of the semiconductor laser taken as the third example of the invention. Here are labeled common reference numerals to identical or equivalent components to those shown in FIGS. 6 and 7, and their detailed explanation is omitted.

In the foregoing second example, the non-doped GaN layer is used as the etching layer 205 as shown in FIG. 6. In the instant example, however, the etching layer 205 has a two-layered structure of a Si-doped or non-doped GaN layer 205A and a Mg-doped GaN layer 205B as shown in FIG. 8.

It would be radically desirable that the Mg-doped AlGaN layer 206 serving as the current blocking layer has a higher Al composition and a larger film thickness. If actually so, however, cracks will be more liable to occur, and in some cases, the layer 206 cannot be made thick enough to substantially function as the current blocking layer. In this example, therefore, Mg is doped into the GaN etching layer 205 to obtain an effective thickness as the current blocking layer.

However, if the Mg-doped GaN layer 205 alone is used as the etching layer, Mg will diffuse into the Si-doped AlGaN etching stop layer 204 during the crystal growth process of Mg-doped GaN layer 205, and will form a p-type AlGaN layer along the interface between the n-type AlGaN etching stop layer 204 and the p-type GaN etching layer 205. And the p-type AlGaN layer will possibly behaves as a barrier between n-type GaN 208 and n-type AlGaN layer 204. In the instant example, therefore, the n-type GaN or non-doped GaN layer 205A is interposed between the p-type GaN etching layer 205B and the n-type AlGaN etching stop layer 204. Employment of this structure enabled realization of the current confinement structure free from cracks inviting current leakage, even when using the AlGaN etching mask layer (current blocking layer) 206 with a high Al composition.

Fourth Example

Next explained is a fourth example of the invention, which is a specific example using an InGaN etching layer 205C (FIG. 9) instead of the GaN etching layer 205 (FIGS. 6 through 8) used in the second and third examples.

Figure 9:
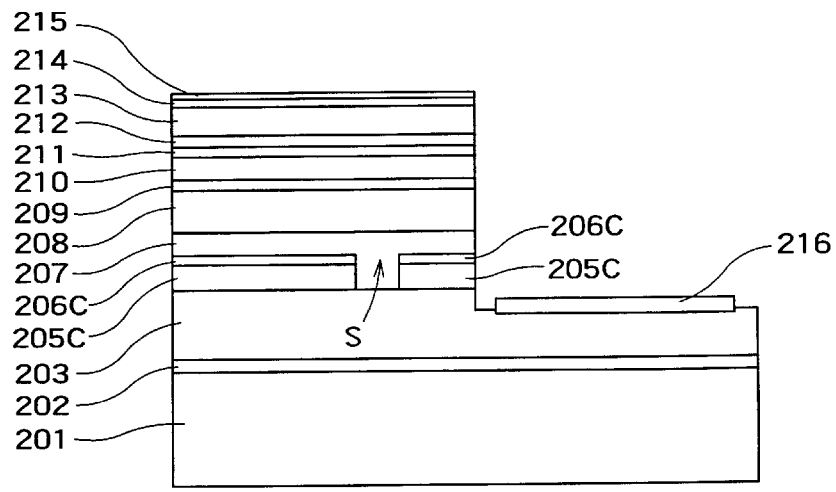
FIG. 9 is a schematic diagram that shows a cross-sectional structure of a semiconductor laser taken as the fourth example of the invention.

FIG. 9 is a schematic diagram that shows a cross-sectional structure of a semiconductor laser taken as the fourth example. Here are used common reference numerals for identical or equivalent components to those sown in FIGS. 6 through 8. In the semiconductor laser of FIG. 9, the etching layer 205C made of InGaN is provided. Further, omitting the AlGaN etching stop layer 204 shown in FIGS. 6 through 8, here is used the Si-doped GaN contact layer 203 as the etching stop layer. Further, here is used Mg-doped GaN as the etching mask layer 206C in lieu of the Mg-doped AlGaN etching mask layer 206 shown in FIGS. 6 through 8. Indium composition of the InGaN etching layer 205C is preferably 0.3 or below because In composition higher than 0.3 will deteriorate the crystallographic property.

The semiconductor laser of FIG. 9 can be simplified in device structure by using the Si-doped GaN n-type contact layer 203 as the etching stop layer.

In the semiconductor laser shown in FIG. 9, a stripe-shaped opening S can be made by selectively etching the InGaN etching layer 205C relative to the GaN etching mask layer 206C and the etching stop layer 203 both made of GaN substantially in the same manner as explained with reference to FIG. 7(c). That is, since the InGaN etching layer 205C is more likely etched than the etching mask layer 206C and the etching stop layer 203 both made of GaN, selective etching is possible by using that difference. However, taking into account that the InGaN etching layer 205C (FIG. 9) is more easily etched than the GaN etching layer 205 (FIG. 7) and that the etching mask layer 206C and the etching stop layer 203 (FIG. 9) both made of GaN are more likely etched than the etching mask layer 206 and the etching layer 204 (FIG. 7) both made of AlGaN, it is desirable that the etching temperature is in the range from 600° C. to 800° C., which is lower than the temperature range in the case of FIG. 7(c). If the etching temperature is higher than 800° C., not only in the etching layer 205C but also in the etching mask layer 206C or even in the etching stop layer 203, etching will progress undesirably. In contrast, if the etching temperature is in the range not higher than 600° C., the etching rate of the etching layer 205C will be impracticably low.

The Inventor has confirmed through experiments that indium composition of the etching layer 205C of FIG. 9 is desired to be 0.05 or more. If the indium composition is below 0.05, etching rate of the etching layer 205C will be excessively low, and selectivity between the etching stop layer 203 and the etching mask layer 206 will be undesirably reduced.

In the laser device of FIG. 9, GaN is used as the etching stop layer 203 and the etching mask layer 206. However, subject to an appropriate selectivity being obtained, InGaN having a lower indium composition than the etching layer 205C can be used instead. Preferably, however, indium composition does not surpass 0.05 to ensure that the etching stop layer 203 and the etching mask layer 206C are not etched.

Fifth Example

Next explained is a structure having voids at opposite side of the opening of the current confinement structure, as the fifth example of the invention.

Figure 10:
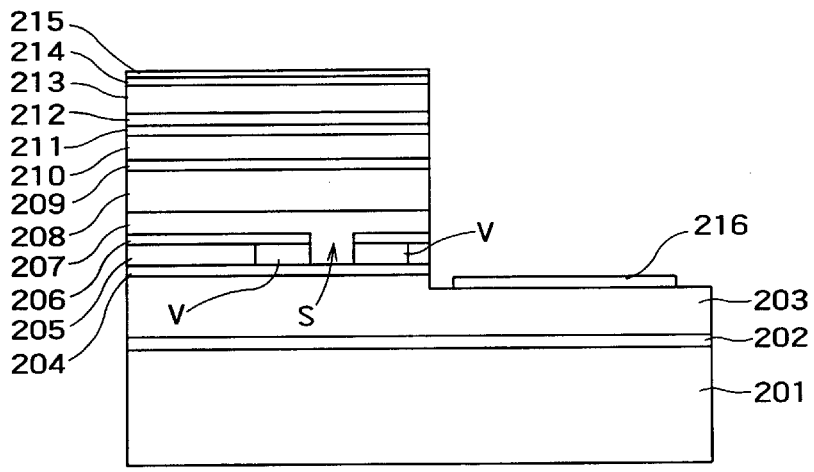
FIG. 10 is a schematic diagram that shows a cross-sectional structure of a semiconductor laser taken as the fifth example of the invention.

FIG. 10 is a schematic diagram that shows a cross-sectional structure of a semiconductor laser taken as the fifth example of the invention. Here are used common reference numerals to identical or equivalent components to those shown in FIGS. 6 through 9, and their detailed explanation is omitted.

As shown in FIG. 10, the semiconductor laser as this example has voids (cavities) at opposite sides of the opening S of the current confinement structure. These voids contributes to increasing the difference in effective refractive index between inside and outside of the opening S and facilitate fabrication of a laser oscillating in the basic transverse mode. That is, the contributes to enhancing the light confinement efficiency to the waveguide and improving the oscillation mode.

Figure 11:
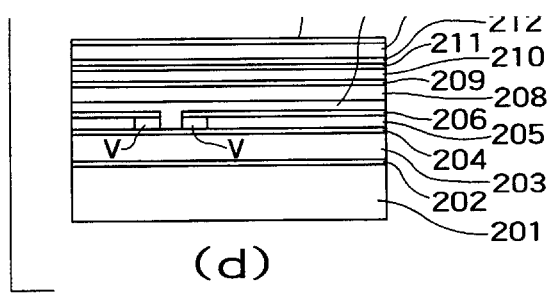
FIG. 11 presents schematic cross-sectional views illustrating a manufacturing process in a manufacturing method of the semiconductor laser taken as the fifth example of the invention.
Figure 11:
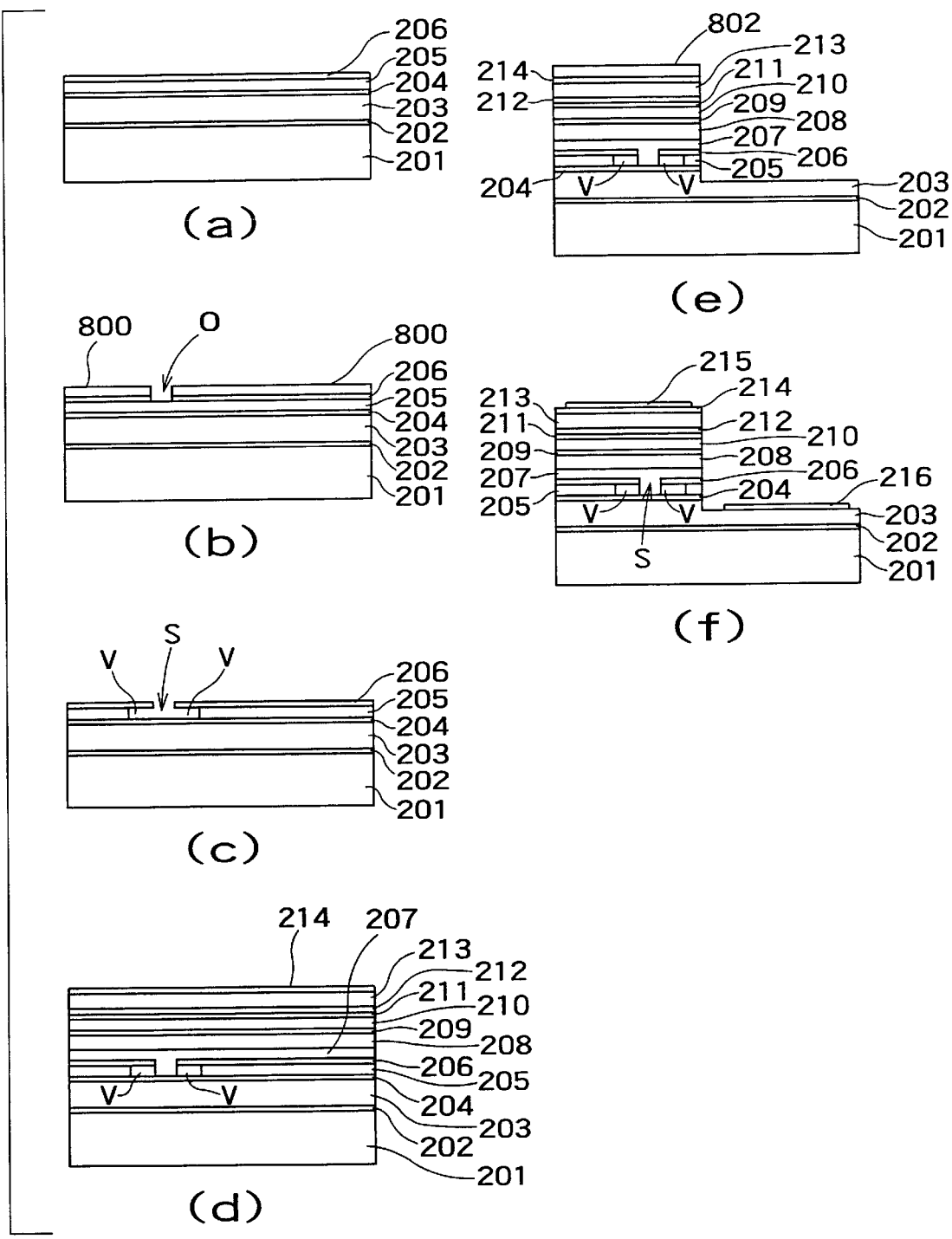
Figure 12:
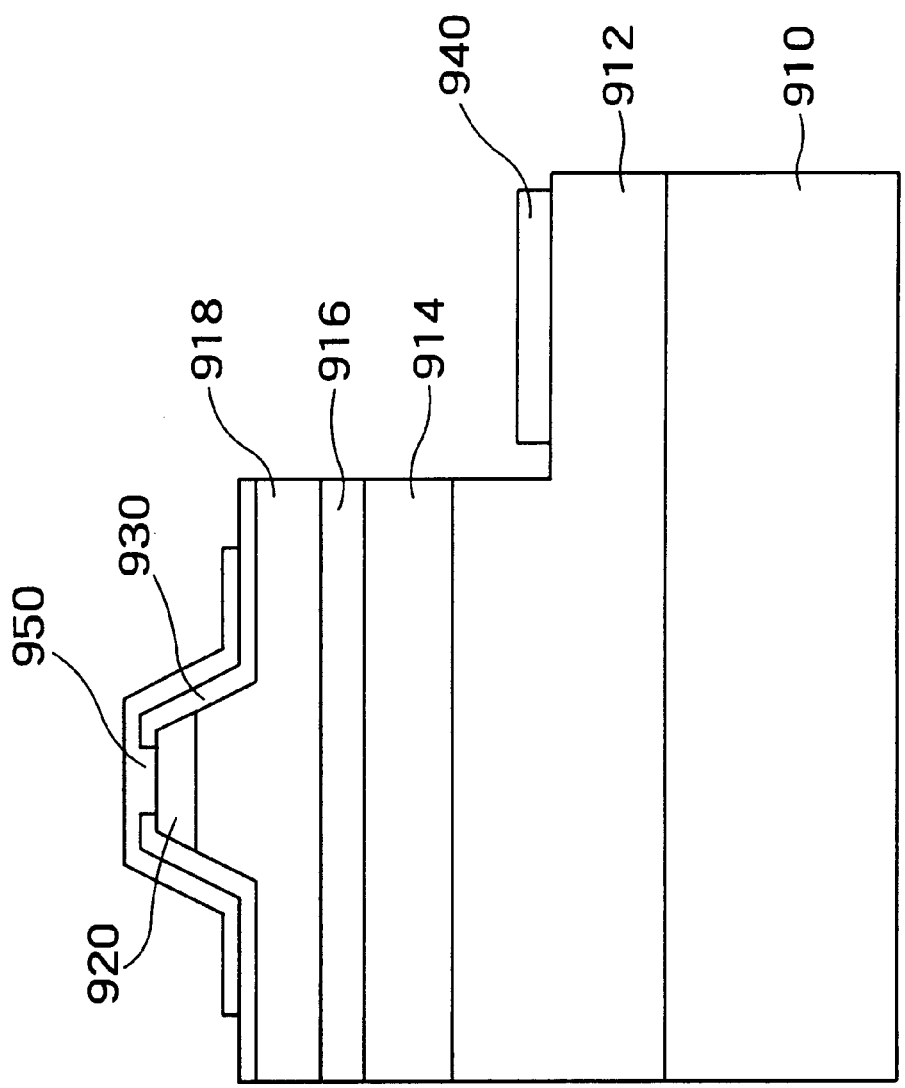
FIG. 12 is a cross-sectional view showing a representative structure of conventional semiconductor lasers.

FIG. 11 presents schematic cross-sectional views illustrating a manufacturing process in a manufacturing method of the semiconductor laser taken as the fifth example of the invention. Basic layer structure and manufacturing process are similar to those of the specific example of FIG. 7.

First as shown in FIG. 11(a), first crystal growth is conducted to grow a buffer layer 202 composed of GaN, AlN or AlGaN, for example, to a thickness around 10 through 200 nm on the sapphire substrate 201 by metal-organic chemical vapor deposition (MOCVD), and thereon, the Si-doped GaN n-type contact layer 203 is grown to the thickness of 3 $\mu$m. Subsequently, the Si-doped $Ga_{0.93}Al_{0.07}N$ n-type etching stop layer 204, 0.1 $\mu$m thick, non-doped GaN etching layer 205, 0.2 $\mu$m thick, and Mg-doped $Ga_{0.8}Al_{0.2}N$ p-type etching mask layer 206, 0.1 $\mu$m thick, are formed.

Next as shown in FIG. 11(b), the etching mask layer 206 is etched. More specifically, the substrate is removed from the MOCVD apparatus, a resist or SiO$_2$ mask 800 having a stripe-shaped window is formed by an exposure process. Using this mask, the Mg-doped Al$_{0.2}$Ga$_{0.8}$N p-type etching mask layer 206 is removed by etching to make a stripe-shaped opening 0 in the p-type etching mask layer 206. In this etching process, dry etching or wet etching using KOH or other etching liquid may be employed.

Subsequently, as shown in FIG. 11(c), the etching layer 205 is etched to make voids V.

More specifically, first removing the mask 800, the substrate is again set in the MOCVD apparatus. Then, 20 SLM of nitrogen gas is supplied and the substrate temperature is raised to 1000° C. In this process, by heating it in the nitrogen gas atmosphere, moisture and impurity gas having adhered on the substrate are removed. On the other hand, GaN and AlGaN are not etched. When the substrate temperature reached 1000° C. introduction of hydrogen gas was started, and mixed gas of containing 20 SLM of nitrogen gas and 10 SLM of hydrogen gas was supplied. In this atmosphere, the substrate was haled at 1000° C. for five minutes. As already explained, selective etching between AlGaN and GaN is attained. Although the Mg-doped Al$_{0.2}$Ga$_{0.8}$N p-type etching mask layer 206 is not etched, the non-doped GaN etching layer 205 is etched.

Once the etching reaches the Si-doped Al$_{0.07}$Ga$_{0.93}$N n-type etching stop layer 204, it no more progresses in the depth direction. However, by prolonging the etching time, side etching can be brought about in response to the time. In the instant example, vapor phase etching for five minutes resulted in bringing about side etching of a width around 5 µm.

Next as shown in FIG. 11(d), burying growth is conducted.

First all, the supply of hydrogen gas is stopped, the supply of ammonium gas is started, and a mixed gas of 20 SLM of nitrogen gas and 10 SLM of ammonium gas is flown to prevent the vapor phase etching, and the substrate temperature is raised to 1080° C. When the substrate temperature reaches 1080° C., the supply of trimethyl gallium (TMG), silane gas and hydrogen gas is simultaneously started to grow the Si-doped GaN buried layer 207. As a result of growth of this layer, the side-etched portions, approximately 5 µm wide, remain as voids V in form of cavities, and the opening S of the current confinement structure is buried flat by growing 0.2 µm Si-doped GaN.

After that, similarly to the second example, sequentially formed are the Si-doped AlGaN n-type cladding layer 208, Si-doped GaN n-type optical guide layer 209, active layer of the InGaN multi quantum well (MQW) structure 210, Mg-doped AlGaN p-type block layer 211, Mg-doped GaN p-type optical guide layer 212, Mg-doped AlGaN p-type cladding layer 213, and Mg-doped GaN p-type contact layer 214.

Thereafter, the substrate is removed from the MOCVD apparatus, a mask 802 is formed on the p-type contact layer 214 by an exposure process, and layers are selectively etches to a half depth of the n-type contact layer 203 by dry etching as shown in FIG. 11(e).

Then, as shown in FIG. 11(f), the n-side electrode 216 was formed on the exposed surface of the n-type contact layer 203, and the p-side electrode 215 was formed on the surface of the p-type contact layer 214.

As explained above, according to the instant example, by adjusting time or other conditions of the vapor phase etching to bring about side etching of the etching layer 205 and thereafter forming the buried layer 207, the voids V can be made reliably and easily at opposite sides of the opening S of the current confining portion. As a result, it is possible to enhance the difference in effective refractive index between inside and outside of the current confinement structure, improve the light confining efficiency of the waveguide and fabricate, easily with a high yield, the semiconductor laser oscillating in the basis transverse mode.

Heretofore, some embodiments of the invention have been explained with reference to specific examples. The invention, however, is not limited to these specific examples.

For example, a skilled in the art will be able to modify the device structures and materials of semiconductor lasers to which the invention is applied, by choosing any known appropriate techniques and designs and will be able to obtain substantially the same effects.

Further, the invention is applicable not only to semiconductor lasers but also to light emitting diodes and other various optical devices and electronic devices to obtain substantially the same effects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser comprising:
   a substrate;
   a nitride semiconductor layer made of a nitride semiconductor on said substrate and having a stripe-shaped opening;
   a buried layer burying said stripe-shaped opening and made of a nitride semiconductor containing at least two kinds of group III elements, said buried layer including a first portion lying in and above said opening and a second portion lying on said nitride semiconductor layer except said stripe-shaped opening, said first portion of said buried layer being different from said second portion of said buried layer in composition ratio of said at least two kinds of group III elements; and
   an active layer formed on said buried layer.

2. The semiconductor laser according to claim 1 wherein said first portion of said buried layer has a higher refractive index than said second portion of said buried layer.

3. The semiconductor laser according to claim 2 wherein said buried layer contains aluminum, and aluminum composition of said first portion of said buried layer is lower than said second portion of said buried layer.

4. The semiconductor laser according to claim 3 wherein said buried layer is made of AlGaN.

5. The semiconductor laser according to claim 1 wherein said buried layer has a superlattice structure made by alternately forming at least two kinds of nitride semiconductor layers which are different in composition, and wherein at least one of said at least two kinds of nitride semiconductor layers in said superlattice structure contains at least two kinds of group III elements, and said nitride semiconductor layer containing said at least two kinds of group III elements varies in composition ratio of said at least two kinds of group III elements between said first portion of said buried layer and said second portion thereof.

6. The semiconductor laser according to claim 5 wherein said buried layer has a superlattice structure of AlGaN and GaN.

7. The semiconductor laser according to claim 1 wherein said nitride semiconductor layer is configured to partly block a current injected into said active layer.

8. The semiconductor laser according to claim 1 wherein the surface of the buried layer is a substantially flat surface.

9. A semiconductor laser comprising:
a substrate;
a first cladding layer of a first conduction type made of a nitride semiconductor of a first conduction type on said substrate;
a current blocking layer formed on said first cladding layer of the first conduction type and having a stripe-shaped opening which partly exposes said first cladding layer of the first conduction type, said current blocking layer having a first layer of a nitride semiconductor formed adjacent to said first cladding layer of the first conduction type and a second layer of a nitride semiconductor formed on said first layer, said first layer being made of a material more likely etched than said second layer and said first cladding layer of the first conduction type;
a second cladding layer of the first conduction type made of a nitride semiconductor of the first conduction type lying in and above said opening and on said current blocking layer so as to bury said stripe-shaped opening; and
an active layer formed on said second cladding layer of the first conduction type.

10. The semiconductor laser according to claim 9 wherein aluminum composition of said first layer of said current blocking layer is lower than aluminum composition of said second layer of said current blocking layer and aluminum composition of said first cladding layer of the first conduction type.

11. The semiconductor laser according to claim 10 wherein said first cladding layer of the first conduction type is made of $Al_xGa_{1-x}N$ ($0.05 \leq x \leq 0.3$), said second layer of said current blocking layer is made of $Al_yGa_{1-y}N$ ($0.05 \leq y \leq 1$, $x \leq y$), and said first layer of said current blocking layer is made of $Al_zGa_{1-z}N$ ($0 \leq z < 0.3$, $z < x$).

12. The semiconductor laser according to claim 9 wherein said first cladding layer of the first conduction type is made of $In_xGa_{1-x}N$ ($0 \leq x \leq 0.05$), said second layer of said current blocking layer is made of $In_yGa_{1-y}N$ ($0 \leq y \leq 0.05$), and said first layer of said current blocking layer is made of $In_zGa_{1-z}N$ ($0.05 \leq z \leq 0.3$, $z > x$, $z > y$).

13. The semiconductor laser according to claim 9 wherein the surface of the second cladding layer of the first conduction type is a substantially flat surface.

14. A semiconductor device comprising:
a base body having at least one recess; and
a buried layer made of a nitride semiconductor containing at least two kinds of group III elements lying on said base body to bury said recess with a part thereof, said buried layer including a first portion lying in and above said recess and a second portion lying on said base body except said recess, said buried layer varying in composition ratio of said at least two kinds of group III elements between said first portion and said second portion.

15. The semiconductor laser according to claim 14 wherein the surface of the buried layer is a substantially flat surface.

16. The semiconductor device comprising:
a base body having at least one recess; and
a buried layer made of a nitride semiconductor containing at least two kinds of group III elements lying on said base body to bury said recess with a part thereof, said buried layer including a first portion lying in and above said recess and a second portion lying on said base body except said recess, said buried layer varying in composition ratio of said at least two kinds of group III elements between said first portion and said second portion,
wherein said first portion of said buried layer has a higher refractive index than said second portion of said buried.

17. The semiconductor laser according to claim 16 wherein said buried layer contains aluminum and has a lower aluminum composition in said first portion than in said second portion.

* * * * *